United States Patent

Knipe

(10) Patent No.: US 8,915,148 B2
(45) Date of Patent: Dec. 23, 2014

(54) MOTION CONVERSION SYSTEM

(75) Inventor: Richard Lee Knipe, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/618,788

(22) Filed: Sep. 14, 2012

(65) Prior Publication Data

US 2013/0213164 A1   Aug. 22, 2013

Related U.S. Application Data

(60) Continuation of application No. 13/466,386, filed on May 8, 2012, now Pat. No. 8,621,938, which is a division of application No. 11/963,072, filed on Dec. 21, 2007, now Pat. No. 8,171,804.

(60) Provisional application No. 60/871,588, filed on Dec. 22, 2006.

(51) Int. Cl.

| | | |
|---|---|---|
| *G01L 1/22* | (2006.01) | |
| *F16H 21/44* | (2006.01) | |
| *B81B 3/00* | (2006.01) | |

(52) U.S. Cl.
CPC ............ *F16H 21/44* (2013.01); *B81B 3/0032* (2013.01); *B81B 2201/038* (2013.01); *B81B 2203/051* (2013.01); *B81B 2203/058* (2013.01)
USPC ........................................................... 73/862

(58) Field of Classification Search
USPC ........................................................... 73/862
See application file for complete search history.

(56) References Cited

U.S. PATENT DOCUMENTS

| | | | |
|---|---|---|---|
| 3,040,136 A | 6/1962 | Grado | |
| 5,535,047 A | 7/1996 | Hornbeck | |
| 5,652,671 A | 7/1997 | Knipe et al. | |
| 5,739,941 A | 4/1998 | Knipe et al. | |
| 6,480,320 B2 * | 11/2002 | Nasiri | 359/291 |
| 6,533,947 B2 | 3/2003 | Nasiri et al. | |
| 6,647,164 B1 | 11/2003 | Weaver et al. | |
| 6,736,521 B1 | 5/2004 | Turner | |
| 6,867,897 B2 | 3/2005 | Patel et al. | |
| 6,935,759 B1 | 8/2005 | Staker et al. | |
| 7,015,885 B2 * | 3/2006 | Novotny et al. | 345/84 |
| 7,119,940 B2 | 10/2006 | Knipe | |
| 7,302,131 B2 * | 11/2007 | Ma et al. | 385/18 |

* cited by examiner

*Primary Examiner* — Lisa Caputo
*Assistant Examiner* — Octavia D. Hollington
(74) *Attorney, Agent, or Firm* — Jacqueline J. Garner; Frederick J. Telecky, Jr.

(57) ABSTRACT

A motion conversion system is described. The motion conversion system comprises a first torsional member operative for rotating in a first direction. A second torsional member is offset a distance from the first torsional member, wherein the second torsional member is operative for rotating in a direction opposite from the first direction. And, a lateral member has a lower surface connected to the first and second torsional members. Wherein, translational movement of the lateral member results from rotational movement of the first and second torsional members.

16 Claims, 4 Drawing Sheets

MOTION CONVERSION SYSTEM

This application is a continuation of application Ser. No. 13/466,386, filed May 8, 2012, which is a division of application Ser. No. 11/963,072, filed Dec. 21, 2007 (now U.S. Pat. No. 8,171,804), which claims the benefit of Provisional Application No. 60/871,588, filed Dec. 22, 2006, the entireties of both of which are hereby incorporated by reference.

DESCRIPTION OF RELATED ART

With the evolution of electronic devices, there is a continual demand for enhanced speed, capacity and efficiency in various areas including electronics, communications, and machinery. Many modern devices include moving components. Efficient operation of these devices may depend upon effectively measuring movement of their components. Techniques for measuring movement may differ depending upon the type of system used. Some systems may have rotational movement that needs to be measured. A microelectromechanical system (MEMS) is usually a system that has electrically controllable micromachines (e.g., a motor, gear, optical modulating element) formed monolithically on a semiconductor substrate using integrated circuit techniques. Measuring movement within a MEMS system may differ substantially from a non-MEMS system. In addition, there are few motion conversion systems that are applicable to various kinds of electrical, mechanical, or electromechanical devices. Moreover, any motion conversion system that is applicable to various environments must also be reliable, robust, and cost effective. Consequently, there remain unmet needs relating to motion conversion systems.

BRIEF DESCRIPTION OF THE DRAWINGS

The invention may be better understood with reference to the following figures. The components within the figures are not necessarily to scale, emphasis instead being placed upon clearly illustrating the principles of the invention. Moreover, in the figures, like reference numerals designate corresponding parts or blocks throughout the different views.

Figure 1:
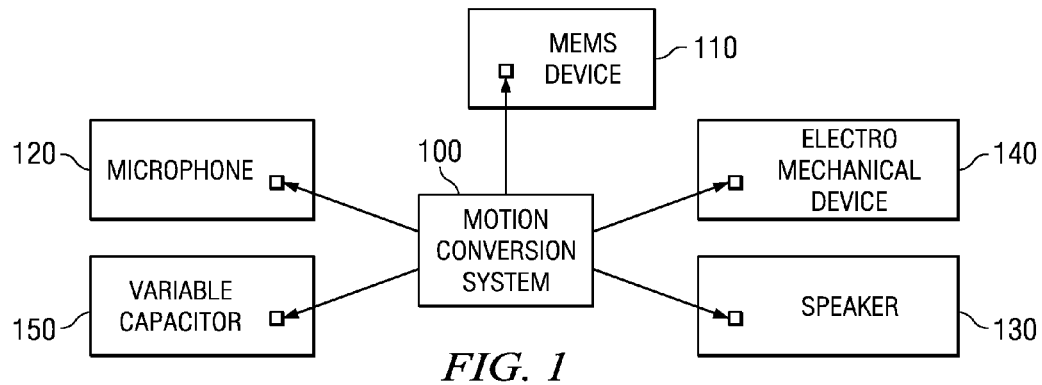
FIG. 1 is an environmental drawing illustrating a variety of devices that may incorporate a motion conversion system.

While the motion conversion system is susceptible to various modifications and alternative forms, specific embodiments have been shown by way of example in the drawings and subsequently are described in detail. It should be understood, however, that the description herein of specific embodiments is not intended to limit the motion conversion system to the particular forms disclosed. In contrast, the intention is to cover all modifications, equivalents, and alternatives falling within the spirit and scope of the motion conversion as defined by this document.

DETAILED DESCRIPTION OF EMBODIMENTS

As used in the specification and the appended claim(s), the singular forms "a," "an" and "the" include plural referents unless the context clearly dictates otherwise. Similarly, "optional" or "optionally" means that the subsequently described event or circumstance may or may not occur, and that the description includes instances where the event or circumstance occurs and instances where it does not.

Torsion generally refers to motion resulting from twisting one end of an object in one direction about a longitudinal axis, while the other end is held motionless or twisted in the opposite direction. Torsional stiffness is an inertial force that may hinder an object from torsional movement. When this stiffness is overcome, torsion may be used to measure movement (e.g., road movement) even when the movement is irregular, or non-uniform.

The present motion conversion system may measure movement by converting rotational motion to translational motion. In general, this system provides a reliable, efficient conversion of rotational motion into translational motion enabling a wide range of applications, such as sensor applications. To accomplish this, the motion conversion system utilizes a hinge architecture that is space-efficient and compact with a high degree of design control and optimization. Furthermore, this motion conversion system may be easily implemented in a wide variety of cost-effective commercial semiconductor fabrication processes. In one implementation, the motion conversion system includes two motion conversion devices, or torsion hinge elements, offset by a finite, fixed distance. The torsional rigidity across a motion conversion device, or torsion hinge element, is independent of deposition stresses and variances. Thus it is uniform. Since the motion conversion system, or dual torsion hinge, is in an offset relationship, this renders the separation distance of the offset torsion hinges an optimizable (or tunable) design parameter. The rigidity of each torsion hinge element within a design may be individually adjusted to provide a desired effect. As a result, the physical relationship of these hinge elements convert rotational movement of an assembly into a linear translational motion, without reliance on complicated, multi-component assemblies.

This motion conversion system may be integrated into a host of devices. Turning now to FIG. 1, this is an illustrative environmental drawing of a variety of devices that may incorporate a motion conversion system 100, such as MEMS device 110. This device may have freely moving elements that may move translationally, rotationally, or a combination of these. Often, the translational movement of an individual sensing element within this type of MEMS device 110 is dependent upon the effective conversion on the rotational motion of these freely moving elements. Since the MEMs device 110 includes the motion conversion system 100, this device may more easily extrapolate and process movement data. Examples of these kinds of MEMS devices may include pressure sensors, accelerometers, inertial sensors, and the like.

More specifically, the fabrication of MEMS device 110 may begin with the fabrication of a complete complementary metal-oxide semiconductor (CMOS) circuit. Since the motion conversion system 100 uses torsional motion, the same fabrication processes may be used for the remaining portions of this MEMS device. In other words, these portions, or the MEMS superstructure, may use the same CMOS fabrication process, which enables harmonization between the underlying circuitry and the superstructure. This harmonization reduces effects associated with transitioning from one material to another. More components can be within a same area. As a result, the implementation of a single chip module becomes more likely.

Returning to FIG. 1, the motion conversion system 100 may also be integrated into other devices. These devices may include a microphone 120, speaker 130, electromechanical device 140, and the like. In fact, the motion conversion system 100 may be implemented in any kind of system where translational motion is desired, such as variable capacitor 150.

Figure 2A:
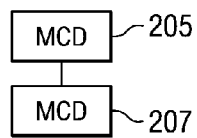
FIGS. 2A-2D are block diagrams illustrating various implementations of a motion conversion system.
Figure 2B:
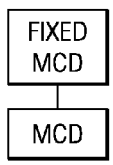
Figure 2C:
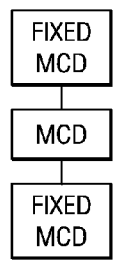

The motion conversion system 100 may be implemented in various configurations as more clearly shown in FIGS. 2A-2D. Each of the illustrated motion conversion systems includes one pair of complementary motion conversion devices, such as motion conversion devices 205, 207. FIG. 2A illustrates a motion conversion system 210 that only includes the motion conversion devices 205, 207. Additional details regarding these complementary motion conversion devices are described in additional detail with regard to FIG. 3. Each of these motion conversion devices may be a torsional hinge element. The complementary motion conversion devices 205, 207 may be collectively referred to as a dual-offset torsion hinge. In addition, either one, or both, of the motion conversion devices that form the dual-offset torsion hinge may be stationary. For the sake of illustration, neither of the motion conversion devices 205, 207 is shown as stationary. In contrast, the motion conversion system 220 of FIG. 2B includes one stationary, or fixed, motion conversion device and one non-stationary motion conversion device. FIG. 2C illustrates a motion conversion system 230 that includes two stationary, or fixed, motion conversion devices and one non-stationary motion conversion device. This implementation illustrates that a motion conversion system may include either an even or an odd number of motion conversion devices.

Figure 2D:
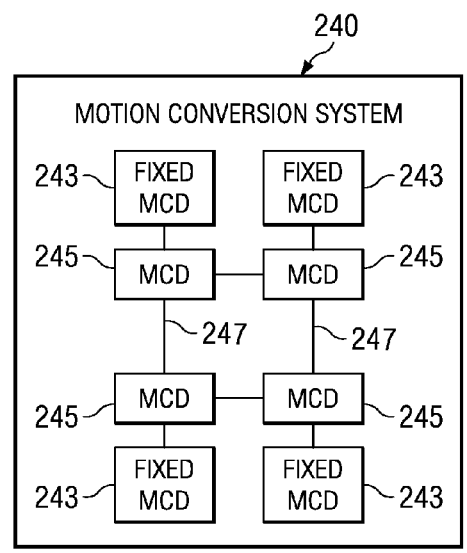

FIG. 2D depicts a motion conversion system 240 that has four dual-offset torsion hinges. While this system includes four of these hinges, the number of hinges included in a motion conversion system 240 may be 6, 3, 10, or some other suitable number. In fact, the number of hinges may be selected to achieve some overall design objective. In the motion conversion system 240, each dual torsion hinge includes one stationary motion conversion device 243 and one non-stationary motion conversion device 245. As described in greater detail with reference to FIG. 3, rotational movement of the motion conversion devices 243 may cause a corresponding translation movement of the motion conversion devices 245. Since these devices are not stationary, they may freely move vertically or horizontally. When a lateral member 247 (e.g., a layer, lamina, or the like) is attached to the motion conversion devices 245, these devices may collectively displace the lateral member 247 vertically or horizontally when they are working in concert. For example, the motion conversion devices 245 may vertically displace the lateral member 247. The amount of this displacement may be customized by altering the number of dual-offset torsion hinges, the relative positions of the dual-offset torsion hinges, the types of motion conversion devices (e.g., fixed motion conversion device) within these hinges, the relative positions of these motion conversion devices within each dual offset hinge, and the like.

Figure 3A:
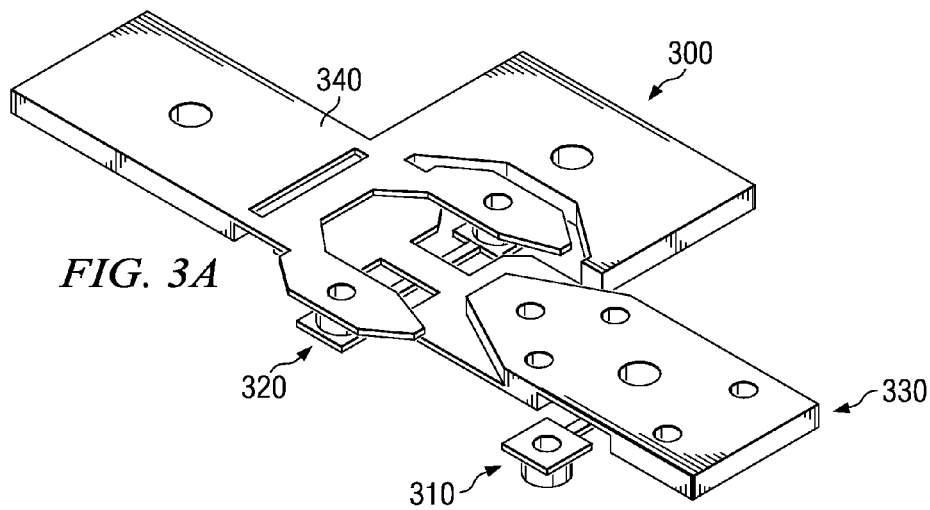
FIGS. 3A-3C are perspective views of the cooperative movement of a pair of the motion conversion devices.

Turning now to FIG. 3A, this figure illustrates the cooperative movement between motion conversion devices within a motion conversion system, such as an offset torsion hinge 300. As mentioned with regard to FIGS. 2A-2D, a motion conversion system (e.g., motion conversion system 230) may include at least two motion conversion devices that operate cooperatively. Similarly, the offset torsion hinge 300 may include multiple motion conversion devices, such as 3, 6, 11, or some other suitable number of motion conversion devices. As an example, the offset torsion hinge 300 includes two motion conversion devices labeled 310, 320.

Figure 3B:
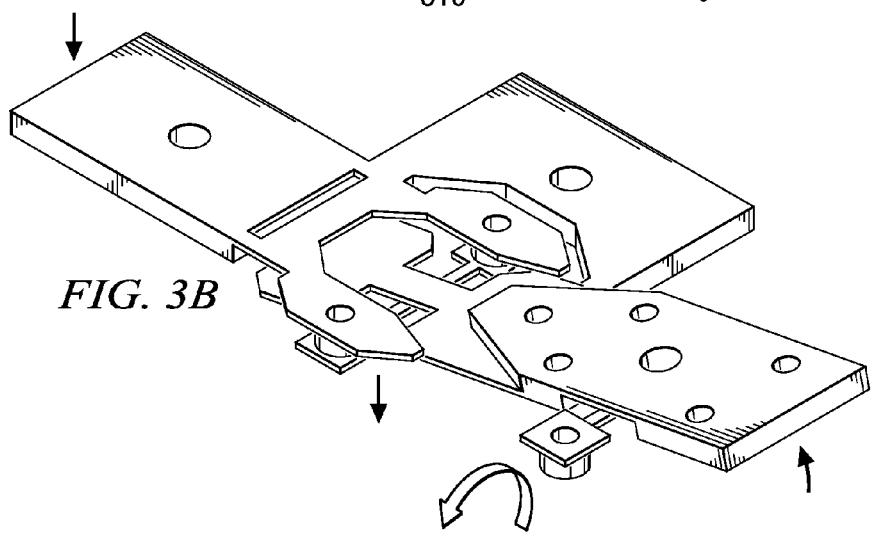

The offset torsion hinge 300 includes a stationary motion conversion device and a nonstationary motion conversion device. The stationary motion conversion device has a stationary hinge support 310; the nonstationary motion conversion device is a movable hinge support 320. A lever 330 is pivotably connected to the stationary support 310 and fixably attached to the movable support 320. A lateral member 340 extends from the lever 330, with a tongue portion of the lever 330 captured between a bifurcated portion vertically spaced from a cross portion extending between the bifurcations of the bifurcated portion. When this lever pivots about a hinge axis defined by the stationary support 310, the lever 330 vertically displaces the movable support 320, which correspondingly displaces the lateral member 340. This movement is more clearly seen in FIGS. 3B-3C. FIG. 3B illustrates how this lever's pivoting in the direction shown by the arrow causes downward displacement of the movable support 320. This downward displacement produces a corresponding downward displacement of the lateral member 340. Similarly, pivoting the lever 330 in the opposite direction causes an upward displacement of the movable support 320 and the lateral member 340 as shown in FIG. 3C.

Figure 3C:
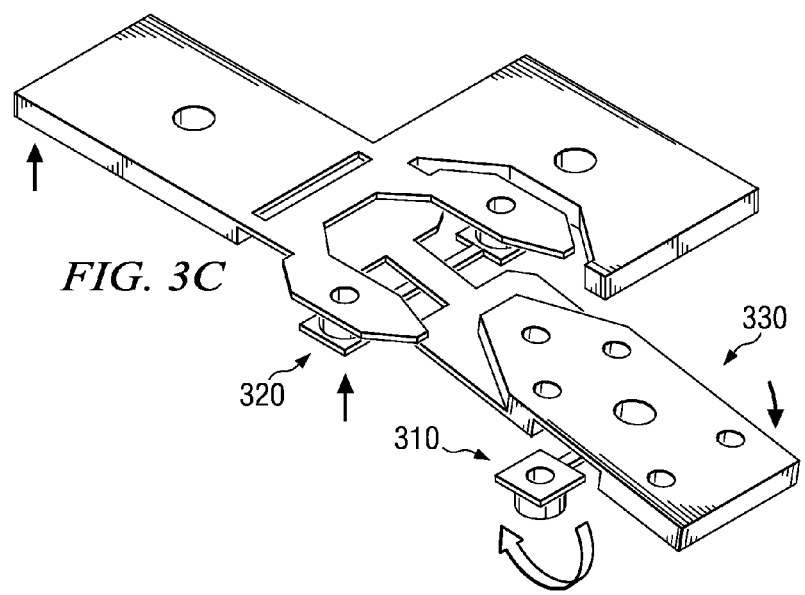

As illustrated in FIGS. 3A-3C, the offset torsion hinge effectively converts rotational motion to translational motion. More specifically, the pivoting motion of the lever 330 produces a translational displacement of the movable support 320. This correspondingly produces a translational displacement of the lateral member 340. These displacements may depend on several factors, which enable this displacement to be customized. For example, the displacement may depend on the distance between the stationary support 310 and the movable support 320. Additional information regarding customizing the displacement is described with reference to FIG. 4.

Figure 4:
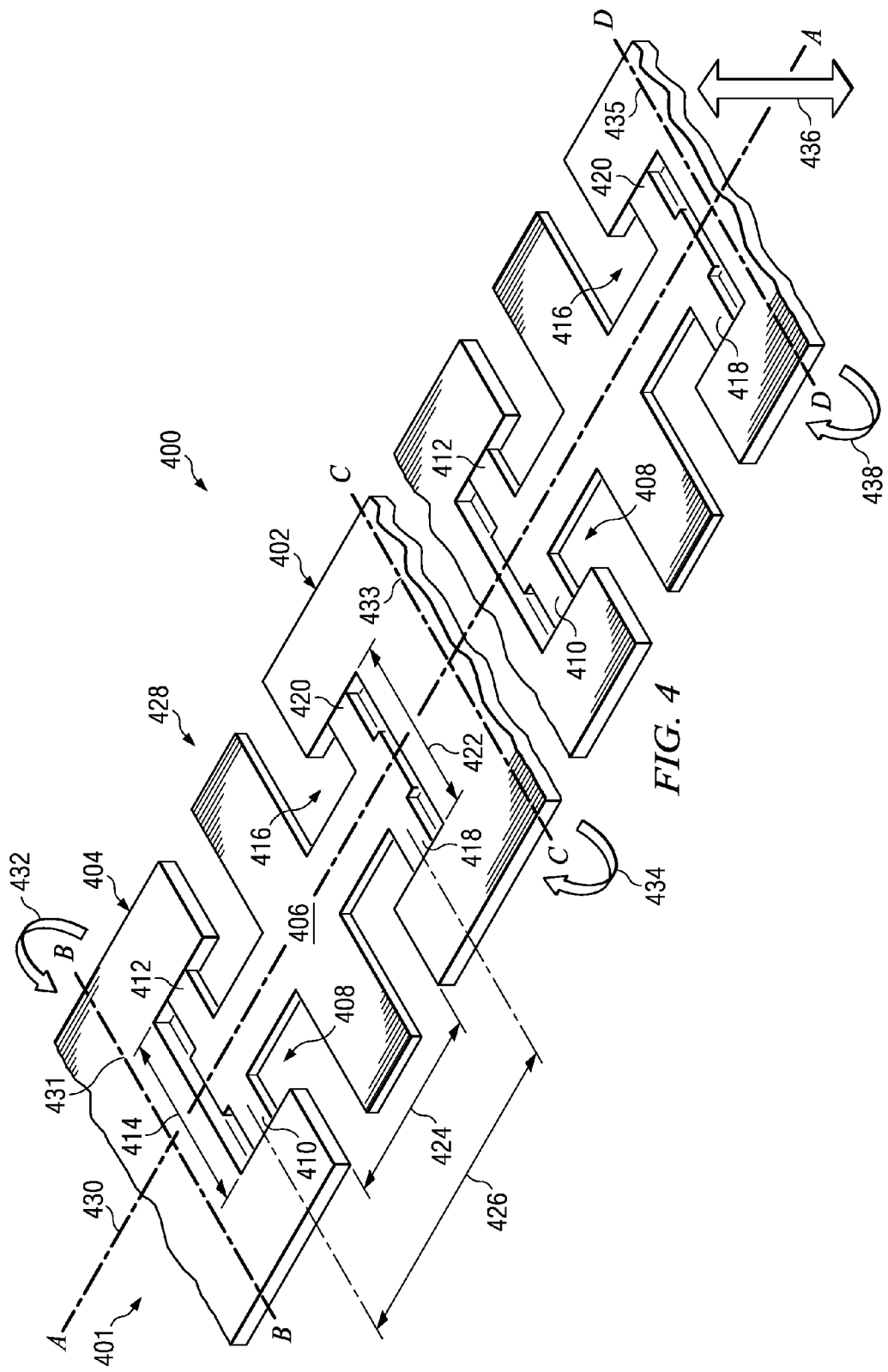
FIG. 4 is a detailed view of the pair of motion conversion devices.

FIG. 4 is a detailed view of a motion conversion system 400 when implemented in a MEMS device, such as MEMS device 110 (see FIG. 1). Though some aspects of this motion conversion device are described with reference to the MEMS device 110, the motion conversion device 300 may be integrated into many other types of devices as described with reference to FIG. 1.

In FIG. 4, a motion conversion system 400 is implemented in a dual-offset torsion hinge architecture. This motion conversion system includes a first segment 401 that has a first MEMS component 402 coupled to a second MEMS component 404 by a hinge element 406. Though not shown, the motion conversion system 400 may include numerous other motion conversion devices, as described with reference to FIGS. 2A-2C. For purposes of explanation and illustration, the MEMS component 402 may be a freely moving MEMS structure (e.g., an inertial sensor component) and the MEMS component 404 may be considered a fixed support structure.

The relation among the first MEMs component 402, the second MEMS component 404, and the hinge component 406 is described in greater detail. A first end 408 of the hinge element 406 is coupled to the component 404 at a first attachment portion 410 and a second attachment portion 412. The attachment portions 410, 412 are in opposing relation to one another on opposite sides of the end 408. They are also offset by a distance 414. A second end 416 of the hinge element 406 is coupled to the component 402 at a first attachment portion 418 and a second attachment portion 420. Like the attachment portions 410, 412, the attachment portions 418, 420 are also in opposing relation to one another on opposite sides of the end 416. They are offset by a distance 422.

Within the motion conversion device 400, the range of motion may be customized for optimal performance. There is a clearance distance 424 between the component 402 and the component 404. Together this clearance distance and the length of the element 406 may be selected produce a desired range of motion. More specifically, the distance 426 between the end 408 and the end 416 may vary the desired range of motion. The desired range of motion corresponds to the displacement described with reference to FIGS. 3A-3C. In other words, the clearance distance 424, the length of the component 404, or the distance 426, may be selected such that a desired displacement, or range of motion, is achieved.

FIG. 4 merely illustrates one design of the illustrated components, though numerous alternatives may result from varying this illustration. For example, the form factor and geometry of the hinge element 406 may be varied greatly for performance reasons. In the embodiment depicted, the hinge element 406 includes a central offset portion 428 that extends symmetrically and orthogonally from the central section of the hinge element 406. This current implementation can impact this element's flexion properties, such as properties that limit a rotational range of motion. Altering these properties for the hinge element 406 may affect its movement. To change the flexion properties, many aspects of the hinge element 406 can be altered. For example, the central offset portion 428 may be smaller, have a different geometry, or the like. Even still, the central offset portion 428 can be completely eliminated, such that the hinge element 406 only includes a central beam section. In the embodiment depicted, the geometries of the constituent parts of the hinge element 406 (e.g., end 408, end 416, and central offset portion 428) utilize right-angled junctions; these parts of the hinge element 406 are also symmetric in nature. In alternative embodiments, however, these parts may utilize acute angles, obtuse angles, combinations of acute and obtuse angles, or various curvatures at element junctions. Alternatively, these parts or portions of these parts may have completely asymmetric geometries, partially asymmetric geometries, or the like. Any of these variations can impact the flexion properties and correspondingly impact the movement.

Returning to FIG. 4, the MEMS component 402, the MEMS component 404, and the hinge element 406 are coplanar structures with identical thicknesses. In an alternative embodiment, they may not be coplanar structures. Moreover, the thickness of one or more of them may be different. For example, the hinge element 406 may have a smaller thickness than the MEMS component 402; this MEMS component may have a smaller thickness than the MEMS component 404. In another alternative embodiment, the MEMS component 402, the MEMS component 404, and the hinge element 406 may be formed from different materials or from the same material. For example, they may be formed from semiconductor materials. In another alternative embodiment, these MEMS components may be formed from a semiconductor material and the hinge element 406 may be formed from a different material.

The hinge element 406 converts rotational movement to translational movement. More specifically, the hinge element 406 is designed and formed such that it converts rotational movement about an axis (B-B) 431 (analogous to rotational movement about the axis of stationary support 310 in FIGS. 3A-3C) into translational movement in a direction orthogonal to axis 431 and also orthogonal to a shared axis (A A) 430 along which the MEMS components 402, 404, 406 are aligned. For example, a device (not shown) may have the MEMS component 404 fixed for rotation about an axis (B-B) within it. Movement of this device may elicit a rotational movement in the direction of the arrow 432 about the axis 431 at the end 408. Since the MEMS component 404 is fixed, the dimensions and geometry of the hinge element 406 causes a corresponding, complementary rotational movement 434 about an axis (C-C) 433 at the end 416. A net effect is translational movement depicted by the arrow 436 in a direction orthogonal to the rotational axes (B-B) 431 and (C-C) 433, and also orthogonal to the shared alignment axis 430. While only briefly described with reference to FIG. 4, a detailed description of this type of motion was described with reference to FIGS. 3A-3C. The complementary rotational movement 434 of the first MEMS component will then similarly elicit a corresponding, complementary rotational movement in the next MEMS component, and so on, until a rotational movement 438 depicted by arrow 438 about an axis (D-D) 435 is elicited in a last motion conversion device aligned along axis (A-A) 430. (The rotational direction 438 indicated in FIG. 4 which is the same as direction 434 assumes an even number of MEMS components in the depicted system 400.)

The design of the hinge element 406 facilitates customization of the motion conversion device 400. In effect, stretching, or flexing, portions of the hinge element 406 increases the torsional stress of that element. As this element rigidity increases, there is a greater resistance to additional movement. This resistance is self-limiting. The self-limiting properties of this hinge element are particularly evident as the ends 408, 416 are flexed. Therefore, one can select the material, design, and geometry of the hinge element 406, such that a desired goal (e.g., a designated amount of translational movement) is accomplished using the self-limiting properties of this hinge element.

While the self-limiting properties of the hinge element 406 is described with reference to a motion conversion system 400 within a MEMS device, these concepts are equally applicable to the motion conversion systems described with reference to FIGS. 1-3C. In fact, the motion conversion system 400 is applicable to variations and adaptations depending upon specific MEMS design or operational objectives. This motion conversion system may be easily integrated in most high-volume commercial semiconductor fabrication processes. To optimize it for a particular system, any one of above-mentioned factors can be adjusted including the self-limiting properties.

Figure 5:
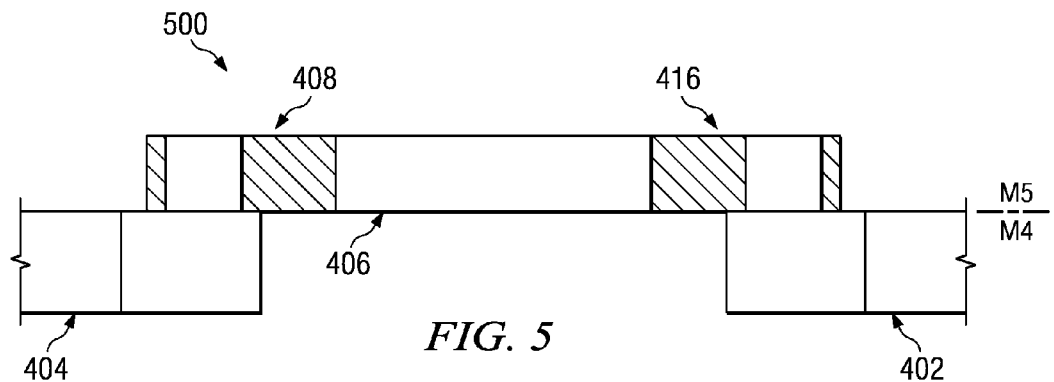
FIG. 5 is a cross-sectional view of a two-layer implementation of a pair of motion conversion devices.

FIG. 5 is a cross-sectional view of a two-layer implementation of a motion conversion system 500. In this embodiment, the MEMS device 402 and the MEMS device 404 are formed in a first device layer, such as metal layer M4. In contrast, the hinge element 406 with ends 408, 416 is formed in a parallel and adjoining device layer, such as metal layer M5. Metal layer M5 is positioned above the metal layer M4. As mentioned above, the same material may be selected for both metal layer M4 and metal layer M5. Alternatively, different materials may be selected for these layers. The selection of the material for each layer as well as other factors, such as the thickness of the layer, may be done to achieve design goals.

Figure 6:
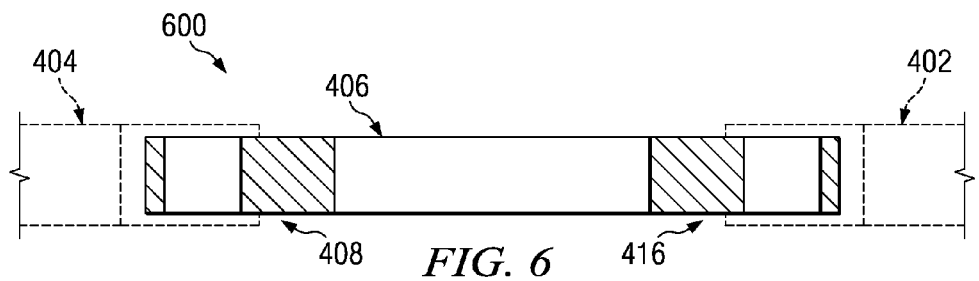
FIG. 6 is a cross-sectional view of a one-layer implementation of a pair of motion conversion devices.

Turning now to FIG. 6, this figure is a cross-sectional view of a one-layer implementation of a motion conversion system 600. In other words, this embodiment depicts a hinge element 406 that is coplanar with the MEMS device 402 and the MEMS device 404. This hinge element is in parallel, but adjoining, planar relation with these MEMS devices.

Figure 7:
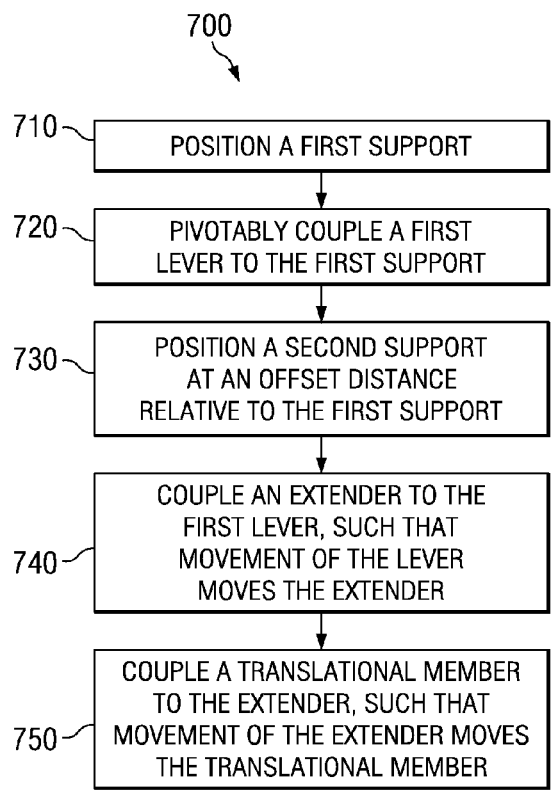
FIG. 7 is a flow chart for a motion conversion technique.

Turning now to FIG. 7, this figure is a flow chart 700 for a motion conversion technique that can be accomplished with any of the previously discussed motion conversion devices. This technique effectively converts rotational motion to translational motion. Any process descriptions or blocks in flow charts can be understood as representing modules, or segments, which may include one or more executable instructions for implementing specific logical functions or blocks in the process. Alternative implementations are included within the scope of the invention in which functions may be executed out of order from that shown or discussed, including substantially concurrently or in reverse order, depending on the functionality involved, as can be understood by those reasonably skilled in the art.

The motion conversion technique of flow chart 700 begins at block 710 by positioning a first support. This first support may be either a stationary support, movable support, or the like. In fact, this support may be a support within any of the motion conversion devices described with reference to FIGS. 1-6. Selecting the position for this support may be based upon certain system related assessments, such as the area available and amount of movement desired. For example, the position for this support member may differ when it is within the microphone 120 than when it is within a MEMS device 110.

Block 710 is followed by block 720. In this block a first lever is pivotably coupled to the first support. In other words, this lever is coupled to the first support in a manner that enables the lever to pivot about the first support. The physical properties of this lever as well as the manner in which it is coupled to the first support may be selected to comply with design objectives, system constraints, or performance objectives. An example of this lever may be lever 330 described with reference to FIG. 3 or the hinge element 406 described with reference to FIGS. 4-6.

Block 730 follows block 720. In an alternative embodiment (not shown), block 720 and block 730 may be completed contemporaneously. In block 730, a second support is positioned at an offset distance from the first support. Like the first support, the second support may be a stationary support, movable support, or the like. In addition, the offset distance between the first support and the second support may be selected to generate design constraints. For example, the offset distance between these supports may be selected to produce a certain amount of translational motion from rotational motion.

Block 740 follows block 730. In an alternative embodiment, block 730 and block 740 may be completed contemporaneously. Block 750 follows block 740. These blocks work together to help facilitate the conversion of rotational motion to translational motion. As the lever pivots, it correspondingly moves an extender coupled to the lever. Moving the extender displaces a translational member coupled to the extender. The extender and translational member can be jointly referred to as the lateral member 340 described with reference to FIG. 3. Selecting the physical properties of the extender and the translational member may also be based on design constraints. For example, the dimensions of these members may be customized in light of a desired amount of translational motion.

While various embodiments of the motion conversion system have been described, it may be apparent to those of ordinary skill in the art that many more embodiments and implementations are possible that are within the scope of this system. Although certain aspects of the motion conversion system may be described in relation to specific techniques or structures, the teachings and principles of the present system are not limited solely to such examples. All such modifications are intended to be included within the scope of this disclosure and the present motion conversion system and protected by the following claim(s).

What is claimed is:

1. A microelectromechanical system (MEMS) device, comprising:
   a movable first MEMS component;
   a second MEMS component comprising a support structure fixed for rotation about a first axis and separated by a clearance distance from the first MEMS component; and
   a hinge element having a first end connected to the second MEMS component and a second end connected to the first MEMS component;
   the first MEMS component, second MEMS component, hinge and first and second hinge ends aligned along a second axis orthogonal to the first axis; and
   the hinge element configured and dimensioned so that rotational movement of the second MEMS component about the first axis causes corresponding, complementary rotational movement of the first MEMS component, causing translational movement of the first MEMS component in a direction orthogonal to the first and second axes.

2. The device of claim 1, wherein the first end is connected to the second MEMS component at first and second opposing first end attachment portions offset by a distance from the second axis on opposite sides of the first end; and the second end is connected to the first MEMS component at first and second opposing second end attachment portions offset by a distance from the second axis on opposite sides of the second end.

3. The device of claim 2, wherein the hinge element includes a central offset portion that extends symmetrically and orthogonally outwardly relative to the second axis from a central beam section of the hinge element.

4. The device of claim 3, wherein the first and second MEMS components and the hinge element are aligned along a shared longitudinal axis.

5. The device of claim 4, wherein the first and second MEMS components and the hinge element are formed in a same device metal layer.

6. The device of claim 4, wherein the hinge element and first and second MEMS components have identical thicknesses.

7. The device of claim 4, wherein at least one of the first and second MEMS components is formed from semiconductor material.

8. The device of claim 1, wherein the hinge element includes a central offset portion that extends symmetrically and orthogonally outwardly relative to the second axis from a central beam section of the hinge element.

9. The device of claim 1, wherein the first and second MEMS components and the hinge element are aligned along a shared longitudinal axis.

10. The device of claim 1, wherein the first and second MEMS components and the hinge element are formed in a same device metal layer.

11. The device of claim 1, wherein the hinge element and first and second MEMS components have identical thicknesses.

12. The device of claim 1, wherein at least one of the first and second MEMS components is formed from semiconductor material.

13. The device of claim 1, further comprising:
   a third MEMS component rotatable about a third axis spaced from and parallel to the first axis;
   a second hinge element connecting the first and third MEMS components so that rotational movement of one of the first or third MEMS components about the corresponding one of the first or third axis causes corresponding, complementary rotational movement of the other of the first or third MEMS component about the corresponding other of the first or third axis, causing translational movement of the first MEMS component relative to the third MEMS component in the direction orthogonal to the first, second and third axes.

14. The device of claim 1, further comprising:
a third MEMS component rotatable about a third axis spaced from and parallel to the first axis;
a second hinge element connecting the first and third MEMS components so that rotational movement of the third MEMS component about the third axis causes corresponding, complementary rotational movement of the first MEMS component, causing translational movement of the first MEMS component relative to the third MEMS component in the direction orthogonal to the first, second and third axes.

15. A microelectromechanical system (MEMS) device, comprising:
a movable first MEMS component;
a second MEMS component comprising a first support structure fixed for rotation about a first axis and separated by a first clearance distance from the first MEMS component;
a first hinge element having a first end connected to the second MEMS component and a second end connected to a first end of the first MEMS component;
a third MEMS component comprising a second support structure fixed for rotation about a second axis parallel to the first axis and separated by a second clearance distance from the first MEMS component; and
a second hinge element having a first end connected to the third MEMS component and a second end connected to second end of the first MEMS component;
the first, second and third MEMS components, the first and second hinges, and the first and second hinge ends of the first and second hinges being aligned along a third axis orthogonal to the first and second axes; and
the first and second hinge elements being configured and dimensioned so that rotational movement of each of the second and third MEMS components about its respective first or second axis causes corresponding, complementary rotational movement of the first MEMS component, causing translational movement of the first MEMS component in a direction (436) orthogonal to the first, second and third axes.

16. A microelectromechanical system (MEMS) device, comprising:
a movable first elongated MEMS component;
a second elongated MEMS component comprising a support structure fixed for rotation about a pivotal axis and separated by a clearance distance from the first MEMS component; and
an elongated hinge element having a first end connected to the second MEMS component and a second end connected to the first MEMS component;
the elongations of the first and second MEMS components and of the hinge and the first and second hinge ends being aligned along a longitudinal axis orthogonal to the pivotal axis; and
the hinge element configured and dimensioned so that rotational movement of the second MEMS component about the pivotal axis causes corresponding, complementary rotational movement of the first MEMS component, causing translational movement of the first MEMS component in a direction orthogonal to the pivotal and longitudinal axes.

* * * * *